(12) United States Patent
Grover et al.

(10) Patent No.: US 6,566,708 B1
(45) Date of Patent: May 20, 2003

(54) TRENCH-GATE FIELD-EFFECT TRANSISTORS WITH LOW GATE-DRAIN CAPACITANCE AND THEIR MANUFACTURE

(75) Inventors: Raymond J. Grover, Manchester (GB); Steven T. Peake, Warrington (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/993,201

(22) Filed: Nov. 16, 2001

(30) Foreign Application Priority Data

Nov. 17, 2000 (GB) .............................................. 0028031

(51) Int. Cl.$^7$ ........................ H01L 29/76; H01L 31/062; H01L 31/119
(52) U.S. Cl. ........................ 257/330; 257/135; 257/262; 257/302; 257/333; 438/259; 438/270
(58) Field of Search ................................ 257/328, 329, 257/330, 331, 332, 333, 339, 135, 134, 133, 119–122, 256, 260, 261, 262, 302; 438/212, 268, 259, 270, 271, 133–137, 242

(56) References Cited

U.S. PATENT DOCUMENTS 5,623,152 A * 4/1997 Majumdar et al. .......... 257/329
5,689,128 A * 11/1997 Hshieh et al. ............... 257/329
5,998,833 A   12/1999 Baliga ......................... 257/329
6,172,398 B1 * 1/2001 Hshieh ........................ 257/328

* cited by examiner

Primary Examiner—Carl Whitehead, Jr.
Assistant Examiner—Thanhha S Pham
(74) Attorney, Agent, or Firm—Steven R. Biren

(57) ABSTRACT

Trench-gate field-effect transistors, for example power MOSFETs, are disclosed having trenched electrode configurations (11,23) that permit fast switching of the transistor, while also providing over-voltage protection for the gate dielectric (21) and facilitating manufacture. The gate electrode (11) comprising a semiconductor material of one conductivity type (n) is present in an upper part of a deeper insulated trench (20,21) that extends into a drain region (14,14a) of the transistor. A lower electrode (23) connected to a source (13,33) of the transistor is present in the lower part of the trench. This lower electrode (23) comprises a semiconductor material of opposite conductivity type (p) that adjoins the semiconductor material of the gate electrode (11) to form a p-n junction (31) between the gate electrode (11) and the lower electrode (23). The p-n junction (31) provides a protection diode (D) between the gate electrode (11) and the source (13,33). The gate electrode (11) is shielded from most of the drain region by the lower electrode (23), so reducing the gate-drain capacitance and improving the switching speed of the transistor.

8 Claims, 5 Drawing Sheets

TRENCH-GATE FIELD-EFFECT TRANSISTORS WITH LOW GATE-DRAIN CAPACITANCE AND THEIR MANUFACTURE

BACKGROUND AND SUMMARY OF THE INVENTION

This invention relates to trench-gate field-effect transistors, for example power MOSFETs for fast switching applications, and further relates to methods of manufacturing such transistors.

Trench-gate field-effect transistors are known comprising a semiconductor body, in which an insulated trench extends from a surface of the body into a drain region of the transistor, and a gate electrode comprising a semiconductor material of one conductivity type is present in at least an upper part of the trench to form an insulated gate of the transistor. In the transistors for fast switching that are disclosed in U.S. Pat. No. 5,998,833, a lower electrode is present in a lower part of the trench and is connected to a source of the transistor to shield the insulated gate from most of the drain region. By this means, the gate-drain capacitance is reduced. The whole contents of U.S. Pat. No. 5,998,833 are hereby incorporated herein as reference material.

The lower electrode is also of semiconductor material of the one conductivity type (typically n-type polycrystalline silicon) and is insulated from the gate electrode by an intermediate insulating layer between the lower and upper parts of the trench. The source electrode of the transistor is connected to the lower electrode outside the plane of the drawings in U.S. Pat. No. 5,998,833. This connection is not straightforward, in that it presumably requires (1) the intermediate insulating layer to be locally removed or locally not provided, but (2) the connection still to be isolated from the gate electrode.

It is an aim of the present invention to provide further improvement of a trench-gate field-effect transistor for fast switching applications and to facilitate its manufacture.

According to one aspect of the present invention, there is provided a trench-gate field-effect transistor having a lower electrode that comprises a semiconductor material of opposite conductivity type in the lower part of the trench. By forming a p-n junction with the gate electrode, this opposite type material of the lower electrode avoids the prior-art need for an intermediate insulating layer between the lower electrode and the gate electrode. By connecting this opposite type material of the lower electrode to a source of the transistor, the gate electrode of the transistor is shielded from most of the drain region. Thereby, the gate-drain capacitance is reduced, and a fast switching characteristic can be achieved for the transistor. Furthermore, by forming the p-n junction with the gate electrode, the opposite type material of the lower electrode may additionally provide a p-n protection diode between the gate electrode and source of the transistor.

Such a device can have the features set out in claim 1.

Under normal operating conditions, the gate bias with respect to the source is less than the zener breakdown voltage or avalanche breakdown voltage of the p-n junction. As such, it will reverse bias the p-n protection diode in a blocking state. However, this diode will conduct when the source-gate voltage exceeds the zener or avalanche breakdown voltage. Thereby, the gate dielectric can be protected from damage that might otherwise result from, for example, a buildup of static charge on the insulated gate or with an excess voltage from a gate driver circuit.

The source connections to the lower electrode may be made at distributed locations in the device layout. This is particularly advantageous for a power transistor, in which there may be a considerable length of gate trench throughout the layout of the device. The spacing of these source connections can be sufficiently close to ensure that the displacement current from the capacitance between the drain and this lower electrode is conducted away efficiently through the series resistance of the lower electrode.

Although the inclusion of the lower electrode in the lower part of the trench increases the gate-source capacitance, its junction capacitance can be reduced by appropriate choice of doping concentrations. Thus, the spread of the depletion layer can be widened in the lower electrode by making its semiconductor material only lightly doped at least adjacent to the p-n junction. Furthermore, for the same reason, the gate electrode may be made lightly doped adjacent to the p-n junction.

Devices in accordance with the invention can be manufactured advantageously using a method according to a second aspect of the invention. Such a method can have, for example, the features set out as follows:

A first simple but convenient process for forming the lower electrode and gate electrode involves the steps of:
   depositing semiconductor material for providing an electrode of a first conductivity type in the insulated trench and etching it back so as to remain in only the lower part of the trench, and
   then depositing semiconductor material of a second conductivity type on the remaining semiconductor material of the first conductivity type so as to provide the gate electrode in the upper part of the trench and to form the intermediate p-n junction.

A second simple but convenient process for forming the lower electrode and gate electrode involves the steps of:
   depositing semiconductor material for providing an electrode of a first conductivity type in the insulated trench, and
   doping the deposited semiconductor material in the upper part of the trench with dopant of a second conductivity type so as to provide the gate electrode in the upper part of the trench and to form the intermediate p-n junction between the gate electrode and a remaining lower electrode of the first conductivity type.

Because the lower electrode forms a p-n junction with the gate electrode, it is self-isolated from the gate electrode. This construction of gate electrode and lower electrode opens up several possibilities for providing, in a simple and convenient manner, an electrical connection between the lower electrode and a source of the transistor.

Particular examples of such processes for providing the desired connection include:
   masking a source-connection area of the trench when etching back the electrode material in the upper part of the trench in the first process;
   masking a source-connection area of the electrode material in the trench when carrying out the doping of the second conductivity type (to provide the gate electrode) in the second process;
   locally doping with dopant of the first conductivity the semiconductor material in the upper part of the trench at a source-connection area;
   etching away the semiconductor material of the gate electrode at an isolated gate area to form a contact hole to the lower electrode.

BRIEF DESCRIPTION OF THE DRAWINGS

These and other advantageous features in accordance with the present invention are illustrated in embodiments that are now described, by way of example, with reference to the accompanying diagrammatic drawings. In these drawings.

DETAILED DESCRIPTION OF THE INVENTION

Figure 1:
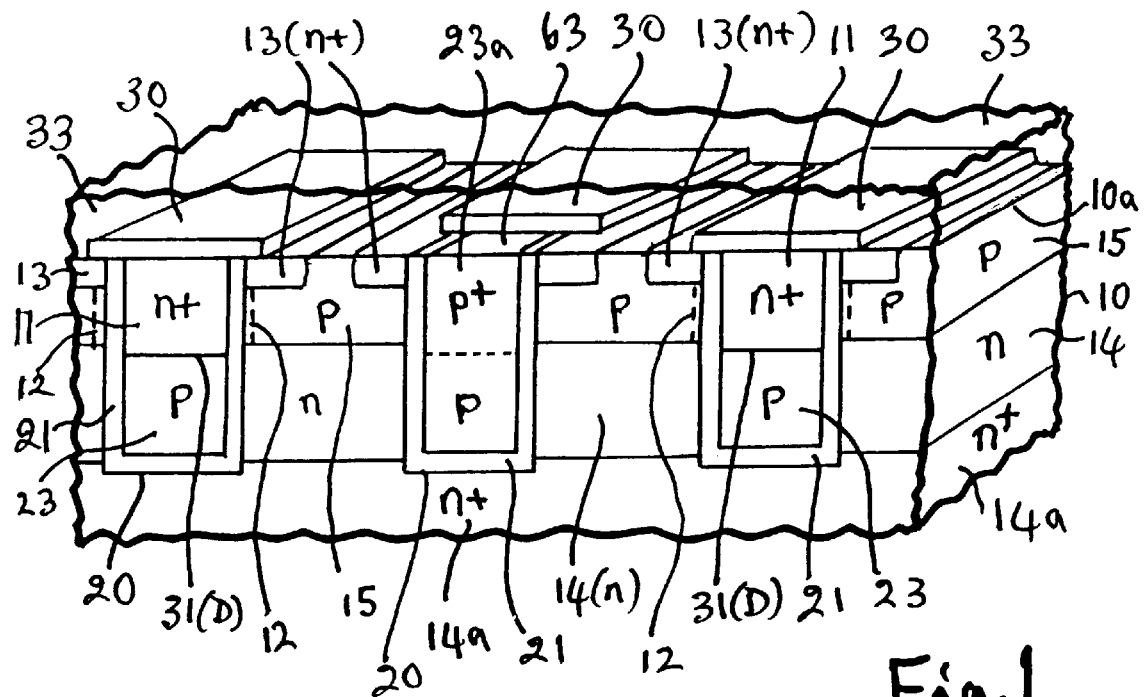
FIG. 1 is a cross-sectional view of an active central part of one specific embodiment of a trench-gate field-effect transistor in accordance with the invention.

It should be noted that all the Figures are diagrammatic, and that relative dimensions and proportions of parts of the drawings have been shown exaggerated or reduced in size, for the sake of clarity and convenience in the drawings. The same reference numbers are generally used to refer to corresponding or similar features in modified and different embodiments of the devices and their manufacture in accordance with the invention.

FIG. 1 illustrates an exemplary embodiment of an n-channel cellular power MOSFET device having a trench-gate 11 in a semiconductor body 10. In the transistor cell areas of this device, a transistor body region 15 (also termed "base" region) of a first conductivity type (i.e. p-type in this example) separates source and drain regions 13 and 14, respectively, of an opposite second conductivity type (n-type in this example). A trench 20 extends through the regions 13 and 15 into an underlying portion of the drain region 14. The side-walls and bottom of the trench 20 are lined with one or more insulating materials 21. The gate 11 is present in the upper part of this insulated trench 20,21, of which the adjacent area of insulating material 21 provides the gate dielectric of the MOSFET. The application of a voltage signal to this insulated gate 11 in the on-state of the device serves in known manner for inducing a conduction channel 12 in an adjacent channel-accommodating portion of the region 15 and for controlling current flow in this conduction channel 12 between the source and drain regions 13 and 14. Typically, the source region 13 is grounded.

The source region 13 of each cell is located adjacent to the top major surface 10a of the body 10 where it is contacted by a first main electrode 33 (source), typically of aluminium or another high-conductivity metal. An insulating layer 30 is present over the top of the gate electrode 11 to insulate the gate electrode 11 from the overlying source electrode 33, in known manner.

The drain region 14 is common to all the cells. In the device structure of FIG. 1, the region 14 is a drain-drift region that is typically formed by an epitaxial layer of higher resistivity (lower doping n) on a substrate region 14a of high conductivity (high doping n+). This substrate region 14a is of the same conductivity type (n-type in this example) as the region 14 to provide a vertical MOSFET, but it may be of opposite conductivity type (p-type in this example) to provide a vertical IGBT instead of a MOSFET. The substrate region 14a is contacted at the bottom major surface of the device body (not shown, but opposite the surface 10a) by a second main electrode (not shown). This second main electrode 34 is the drain electrode in the case of a MOSFET, but is generally called the anode electrode in the case of an IGBT.

In the FIG. 1 embodiment, the insulated trench 20,21 extends from the top surface 10a into the substrate region 14a. In some embodiments of the invention, the insulated trench 20,21 may be shallower and may terminate in the drain-drift region 14.

To make a fast switching device low values are required for the gate-drain capacitance Cgd and the amount Qgd of gate charging and discharging. In a conventional prior-art device, the insulated trench 20,21 is shallower and is filled to its bottom with the trench-gate 11. In this conventional device (e.g. FIGS. 1 & 2 of U.S. Pat. No. 5,998,833), much of the Cgd comes from the extent of the drain-drift region under the gate 11 at the bottom of the insulated trench 20,21. One way to reduce the Cgd is to put a grounded electrode between the gate 11 and the drain-drift region 14. In the devices proposed in U.S. Pat. No. 5,998,833 (e.g. FIGS. 3 & 4 of U.S. Pat. No. 5,998,833), the source-connected, grounded electrode in the lower part of the trench is separated by an intermediate insulating layer from the gate electrode in the upper part of the trench. The present invention provides different and improved device structures and also provides simple processes for their manufacture.

In accordance with the present invention, as illustrated in the embodiment of FIG. 1, the trenched electrode structure comprises:

- a gate electrode 11 of a semiconductor material of one conductivity type (n-type in this example) that is present in an upper part of the insulated trench 20,21 to form the insulated gate of the transistor,

- and a lower electrode 23 of a semiconductor material of opposite conductivity type (i.e. p-type in this example) that is present in a lower part of the insulated trench 20,21 and that adjoins the semiconductor material of the gate electrode 11 to form a p-n junction 31 between the gate electrode 11 and the lower electrode 23.

The lower electrode 23 is grounded by its connection to the source 13,33 of the transistor, so as to shield the insulated gate 11 from most of the drain region 14, 14a. Thus, the lower electrode 23 functions as a Faraday screen, reducing the gate-drain capacitance Cgd. It is the presence of the p-n junction 31 in the semiconductor electrode material 11,31 that allows the lower half (electrode 23) to be at source potential, while the upper half (electrode 11) is at gate potential. This connected structure has the extra benefit that a low voltage zener (or avalanche) diode D is formed which automatically protects the gate dielectric 21 from breaking down due to excessive voltage on the gate electrode 11. Thus, it is the p-n junction 31 itself that provides this p-n protection diode D between the gate electrode 11 and the source 13,33 of the transistor.

Typically, both the n-type gate electrode 11 and the p-type lower electrode 23 are of conductive polycrystalline silicon. Depending on the particular manufacturing process, as described below, a single deposition of semiconductor material in the insulated trench 20,21 may be used to provide both electrodes 23 and 11 (but with opposite conductivity-type dopings). Alternatively, separate depositions may be effected for the two electrodes 23 and 11. In use, the potential difference between gate 11 and source 33 puts a reverse bias across the p-n junction 31 in the trenched double electrode structure 11 & 23.

The p-type and n-type doping concentrations for the electrodes 11 and 23 in the polycrystalline material can be readily chosen so that the diode D formed by the reverse-biased p-n junction 31 (i) has a low leakage current (below breakdown) and (ii) breaks down into a conduction state at a desired level of reverse voltage, for example 6 volts or more. This allows normal gated operation of the trench-gate MOSFET with normal gate voltages, while utilising breakdown of the p-n junction 31 for protection of the gate dielectric 21 with excessive gate voltages. At 6 volts or so, a zener mechanism is used for the breakdown conduction of the diode D. An avalanche mechanism is used if breakdown conduction of the diode D is not required until much higher voltages. The diode D can be designed to protect the gate dielectric 21 against electrostatic damage (ESD), and/or damage from other causes of excessive voltage that may occur on the gate electrode 11. One such likely other cause in some applications is, for example, an over-voltage from a gate drive circuit.

Figure 2:
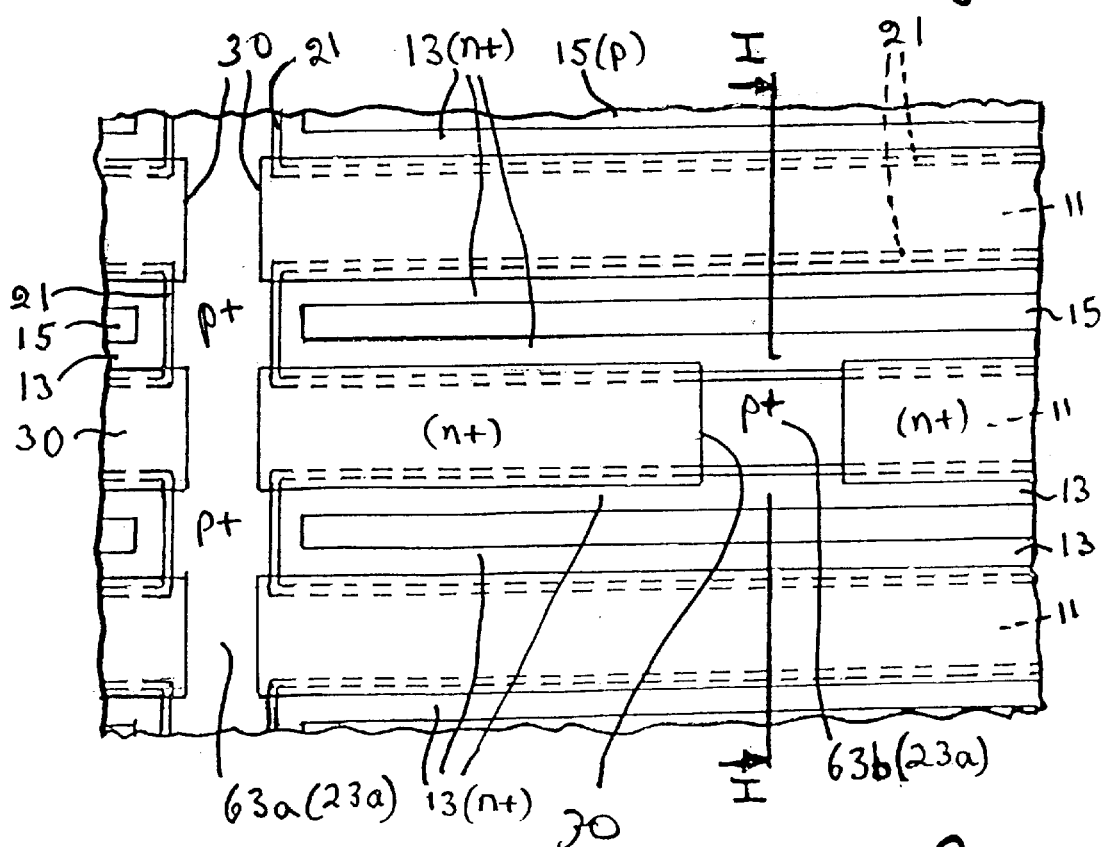
FIG. 2 is a plan view of one possible layout (with a stripe cellular geometry) for the device of FIG. 1, in accordance with the invention.
Figure 3:
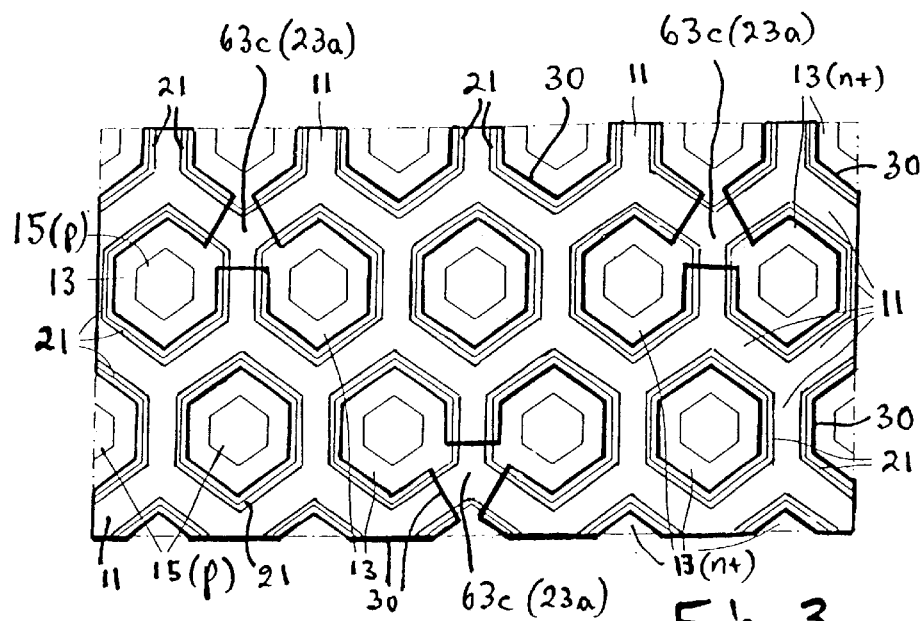
FIG. 3 is a plan view of a different possible layout (with a close-packed hexagonal cellular geometry) for a device similar to that of FIG. 1, also in accordance with the invention.

This trenched double electrode structure 11 & 23 with p-n protection diode 31 may be used with advantage to design fast-switching trench-gate field-effect transistors with any one of a wide variety of device layouts and transistor geometries. In the case of a power device, the device may comprise many thousands of parallel cells between the top main electrode 33 and the substrate region 14a. FIGS. 1 to 3 illustrate only a few of these parallel cells. A stripe geometry is illustrated for the cellular layout of the FIG. 2 device, whereas a close-packed hexagonal geometry is illustrated in FIG. 3. Other cellular geometries may be used, for example the cells may have a square matrix geometry rather than close-packed hexagonal.

The cross-section of FIG. 1 may correspond to that on the line I—I through the parts of four successive cells in the stripe geometry of FIG. 2, or on a similar straight line through parts of four successive cells in a square matrix geometry. A similar cross-section may be found on a bending line through parts of four successive cells in the close-packed hexagonal geometry of FIG. 3.

The p-type lower electrode 23 is connected to the metal source electrode 33 at distributed locations in these power device layouts. Particular examples of these source-connection areas for electrode 23 are designated by reference 63 in FIGS. 1 to 3. These connections to the electrode 23 are made periodically at locations in the trench 20 where the n-type gate electrode 11 is absent. In a stripe geometry such as that of FIG. 2, a stripe-shaped connection area 63a may extend (as shown) across and between the ends of neighbouring striped cells. Alternatively, a discrete connection area 63b (also shown in FIG. 2) may be present at a location on the facing longitudinal sides of two neighbouring striped cells. In the close-packed hexagonal geometry of FIG. 3, discrete connection areas 63c are shown between three facing corners of three neighbouring hexagonal cells.

The spacing of these periodic source-connection areas 63 in the trench layout is sufficiently close to ensure that the displacement current from the capacitance between the drain regions 14 & 14a and the source-connected p-type electrode 23 can be conducted away effectively through the series resistance of the p-type electrode 23. Preferably, the polycrystalline silicon material at the connection area 63 for the electrode 23 has a high doping concentration p+ to have a high conductivity.

In distributing these connection areas 63 in the trench layout, care is needed to ensure that no areas of the gate electrode 11 become isolated, but that all such gate electrode areas are connected to the gate-terminal metallisation. This can be achieved by appropriate layout of the gate electrode 11 itself and/or of the gate-terminal metallisation that contacts the electrode 11. Thus, the stripe-shaped connection area 63a of FIG. 2 is likely to be provided across only one end of a striped cell, whereas a gate connection area (such as a part of the electrode 11) is likely to extend across the opposite end of the cell. For the same reason, the discrete connection area 63b of FIG. 2 is unlikely to be provided on the longitudinal side of a striped cell that has a stripe-shaped connection area 63a across its end.

The trenched double electrode structure 11 & 23 increases the gate-source capacitance Cgs, as there is now a large area capacitance (reverse-biased junction 31) across the gate and source terminals. However, as regards switching time improvement, it is better to swop Cgs for gate-drain capacitance Cgd, because Cgd is a Miller capacitance and is multiplied by the gain of the transistor. Typically, the semiconductor material of the lower electrode 23 has a doping concentration (p) of the opposite conductivity type that is lower in magnitude than the doping concentration (n+) of the one conductivity type of the gate electrode 11. This structure is simple to manufacture, as described below. Furthermore, the junction capacitance of the p-n junction 31 can be minimized by this p-type polycrystalline material being only lightly doped, especially near the p-n junction 31. This light doping (p) widens the spread of the depletion layer in the p-type material from the large-area reverse-biased junction 31. For the same reason, the n-type polycrystalline material of the gate electrode 11 could be more lightly doped near the junction. Thus, for example, the semiconductor material of the gate electrode 11 may have a doping concentration (n+) of the one conductivity type that reduces in magnitude (n) adjacent to the p-n junction 31 with the lower electrode 23.

Although other semiconductor materials such as silicon carbide may be used, the device body 10 is typically of monocrystalline silicon. The electrodes 11 and 23 are typically of polycrystalline silicon. In a typical power MOSFET embodiment, the source regions 13 may have a dopant concentration (n+) of, for example, $10^{19}$ to $10^{21}$ phosphorus or arsenic atoms cm$^{-3}$. A similar or lower high doping concentration (n+) of, for example, $10^{18}$ to $10^{21}$ phosphorus or arsenic atoms cm$^{-3}$ may be provided in the trenched polycrystalline silicon at the area of the gate electrode 11, at least away from the p-n junction 31.

Typically, the MOSFET body region 15 may have a doping concentration (p) of, for example, $10^{16}$ to $10^{17}$ boron atoms cm$^{-3}$ for the channel-accommodating portion, and a higher doping (p+) of, for example, $10^{18}$ to $10^{19}$ boron atoms cm$^{-3}$ where the region 15 is contacted at the surface 10a by the source electrode 33. The same or similar high doping concentration (p+) of, for example, $10^{18}$ to $10^{19}$ boron atoms cm$^{-3}$ may be provided in the trenched polycrystalline silicon at the connection areas 63 where its lower electrode 23 is connected to the source electrode 33. Such a p+ doped connection region 23a of the trenched polycrystalline silicon is illustrated in FIG. 1. The lower electrode 23 itself has a lower doping concentration, for example of $10^{17}$ to $10^{18}$ dopant atoms (boron) cm$^{-3}$.

The thickness of the body region 15 between regions 13 and 14 and the thickness and doping of the drift region 14 between regions 15 and 14a depend on the desired characteristics of the MOSFET. In a high voltage device, the drift region 14 may have a graded doping similar to that disclosed in U.S. Pat. No. 5,998,833, or a uniform doping. In a specific example, the depth (below the surface area 10a) of channel-accommodating portion of the base region 15 may be, for example, 1 μm to 2 μm (micrometers), whereas the thickness of the drift region 14 between regions 15 and 14a may be, for example, 1 μm to 5 μm, or more. The depth of the trench 20 may be, for example, 1 μm to 5 μm. The spacing of neighbouring trenches 20 of neighbouring cells may be sufficiently small that the drift region 14 is depleted by the merging of depletion layers from the trenched insulated electrodes 23 and 11 and from the p-n junction with the body region 15, in the voltage-blocking off-state of the device.

The depth of the p-n junction 31 in the insulated trench 20,21 is sufficient for the n-type gate electrode 11 to overlap with the whole depth of the channel-accommodating portion of the base region 15. Preferably, the overlap of the gate electrode 11 with the drift region 14 is minimised to reduce its effect on Cgd. The remaining depth of the insulated trench 20,21 is filled with the p-type lower electrode 23. Typically, the insulating material 21 may be a single layer of silicon dioxide that lines the trench 20, or a combination of different layers of silicon dioxide and/or silicon nitride, for example.

The opposite conductivity-type double electrode structure 11,31,23 of the present invention can be provided using simple processes, which are also in accordance with the invention.

FIGS. 4 to 7 depict successive stages in one such process of manufacture which, in overview, includes the following steps:

(a) etching a trench 20 from a surface 10a of a semiconductor body 10 into the drain region 14 (through 14 and into 14a, in the example shown), (b) providing insulating material 21 on the bottom and sidewalls of the trench 20 by, for example, thermal oxidation, (c) depositing semiconductor material 230 of a first conductivity type (p) in the trench 20 and etching back the semiconductor material 230 to leave the insulated lower electrode 23 of the first conductivity type in a lower part of the trench 20, (d) depositing semiconductor material 110 of the second conductivity type (n) to provide the insulated gate electrode 11 in an upper part of the trench 20 and to form the p-n junction 31 between the gate electrode 11 and the lower electrode 23, and (e) providing an electrical connection at areas 63 between the lower electrode 11 and the source 13,33 of the transistor to shield the gate electrode 11 from most of the drain region 14,14a and to form the p-n protection diode between the gate electrode 11 and source 13,33 of the transistor.

Figure 4:
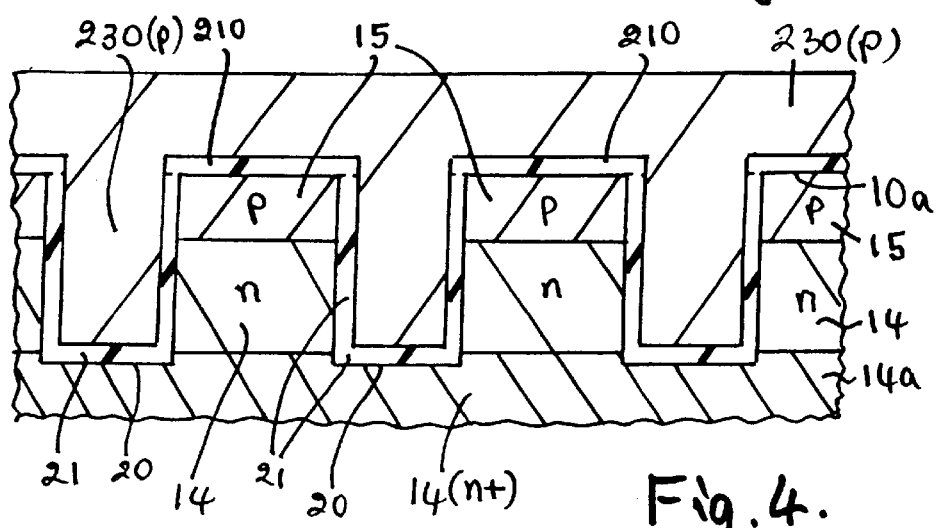
FIGS. 4 to 7 are cross-sectional views of a corresponding FIG. 1 part of a trench-gate field-effect transistor at successive stages in its manufacture by a method in accordance with the invention.

FIG. 4 shows the structure after the deposition of step (c). The layer 210 on the active cell areas of the surface 10a between the insulated trenches 20,21 may be a silicon dioxide layer formed simultaneously with the trench dielectric 21, or it may be at least part of a mask that was used for the etching of the trenches 20.

Figure 5:
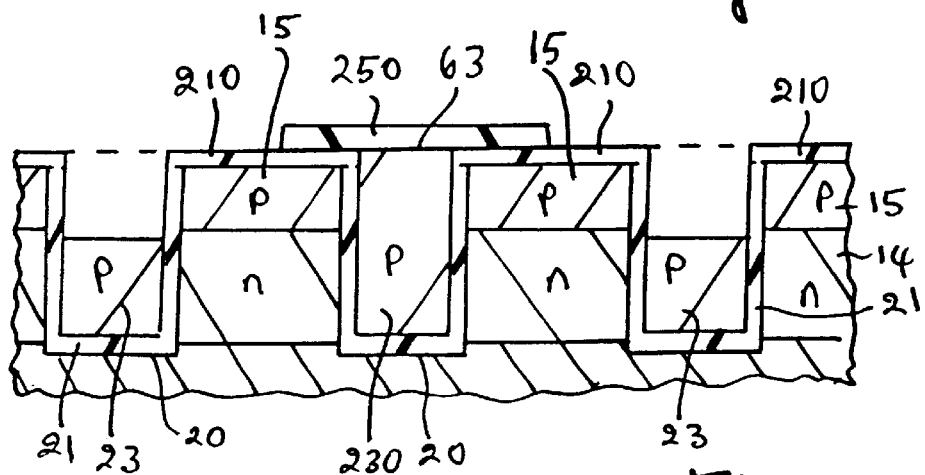
Figure 6:
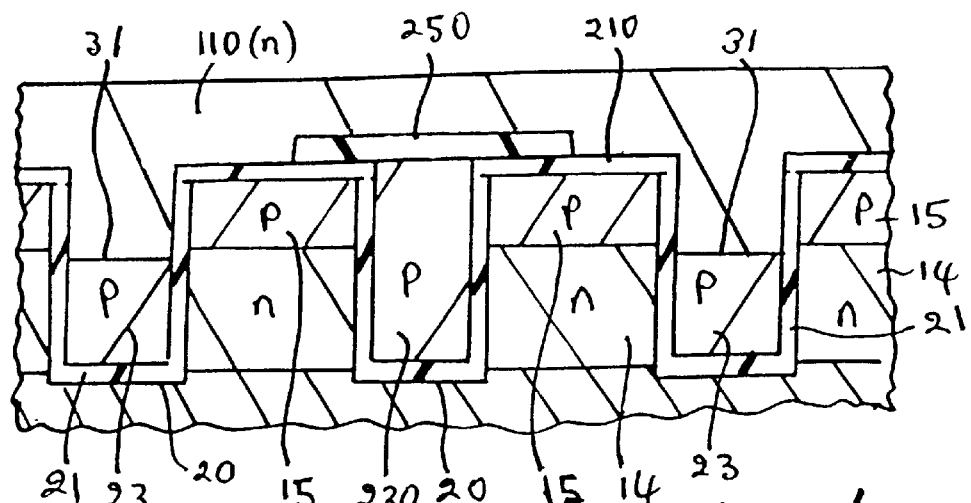

Preferably, at the source-connection areas 63 of the trench 20, the semiconductor material 230 is masked during the etching back so as to remain in the upper part of the trench 20 as a connection region 23a of the first conductivity type (p) for the lower electrode 23. In this case, the initially deposited p-type material 230 of FIG. 4 is first planarised to the top of layer 210 on the surface 10a to just fill the trenches 20. Thereafter, a masking layer 250 is provided over the connection areas 63, and the etch-back of the material 230 is continued to the desired depth in the unmasked areas of the trench 20, as illustrated in FIG. 5. The masking layer 250 may be of, for example, photoresist, which is removed before the deposition of the material 110 for the gate electrode. However, FIG. 6 illustrates the situation in which silicon dioxide or nitride is used for the masking layer 250, which is retained during the deposition of the gate material 110 as protection on the upper surface of the p-type material in the connection area 63.

Figure 7:
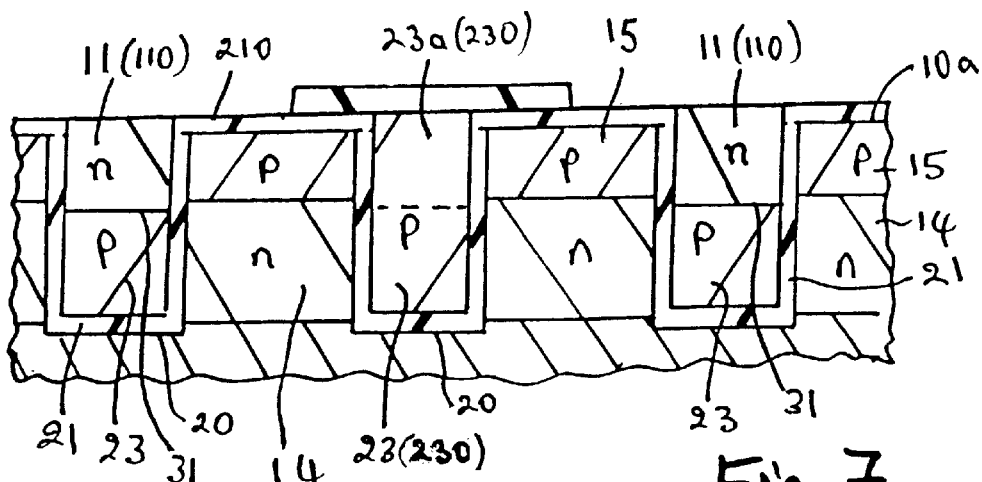

FIG. 7 illustrates the situation after etching back the gate material 110 to the top of the trench 20. Thereafter, an insulating layer 30 is provided on top of the gate electrode 11, and the layers 210 and 250 are etched away to expose the upper surface of the active cell areas between the insulated trenches 20,21 and to expose the trench connection areas 63 for the lower electrode 23. Then, the source electrode 33 is deposited thereon to contact these exposed areas. The top of the gate electrode 11 is insulated from the electrode 33 by the intermediate layer 30.

By way of example, FIGS. 4 to 7 depict the p-type body region 15 being present during these particular stages of the process. This shows merely one of many possible variations. If desired, the p-type body region 15 may be provided later, for example after removing the layer 250 (and even after removing the layer 210) of FIG. 7.

Although not shown in FIGS. 4 to 7, the n-type source region 13 may be provided at an early or late stage of the process. Thus, for example, the n-type source region 13 may be provided before the FIG. 4 stage and so be present in the FIG. 7 structure. The n-type source region 13 may even be provided by implantation and/or diffusion at the FIG. 7 stage, and this implantation and/or diffusion may be used to dope the gate electrode 11. Thus, for example, the polycrystalline material 110 of FIG. 6 may be deposited un-doped, and it may be subsequently doped by this implantation and/or diffusion at the FIG. 7 stage. As there is no transistor channel at the area of the connection region 23a, the masking layer 250 may even be used as part of a mask for defining the lateral extent of the source doping. In this case, the parts of the source region 13 shown in FIG. 1 as adjoining the insulated trench connection region 23a would not be formed.

Figure 8:
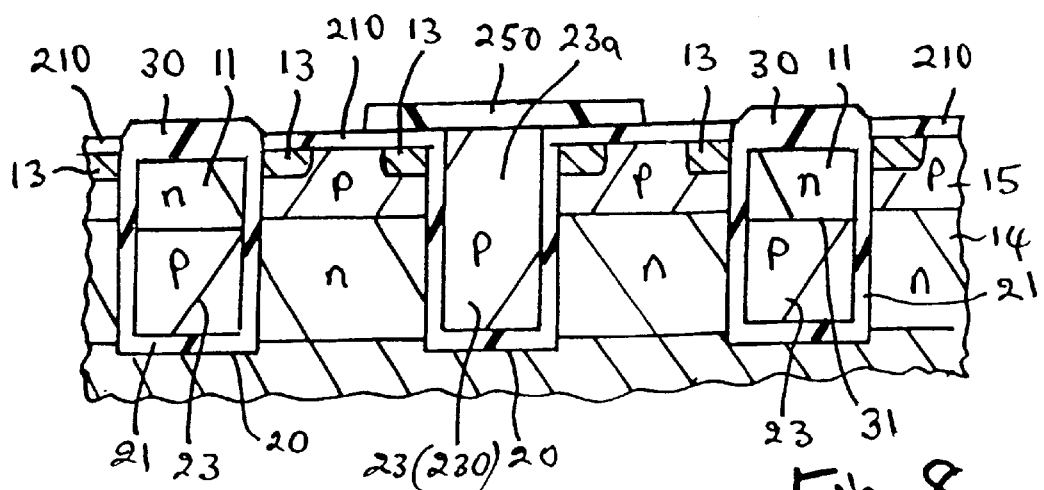
FIGS. 8, 9, 10, 11, 12 & 13 are cross-sectional views of a corresponding FIG. 1 part of a trench-gate field-effect transistor at different stages in its manufacture by various different methods in accordance with the invention.

By way of example, FIGS. 1 to 3 illustrate an insulating layer 30 that not only extends over the trenched gate electrode 11, but also overlaps slightly the active cell areas at the surface 10a. Such an insulating layer 30 can be formed in known manner by depositing insulating material over and between the insulated trenches 20,21 and then photolithographically defining its lateral extent, so as to etch contact windows for the source electrode 33. FIG. 8 illustrates an alternative arrangement in which the insulating layer 30 is formed by thermal oxidation of the polycrystalline-silicon upper surface of the gate electrode 11. In this process, both of the previously used masking layers 210 and 250 may be of silicon nitride, which are then used during this subsequent oxidation to localise the resulting oxide layer 30 to the top of the insulated trench 20,21.

Figure 9:
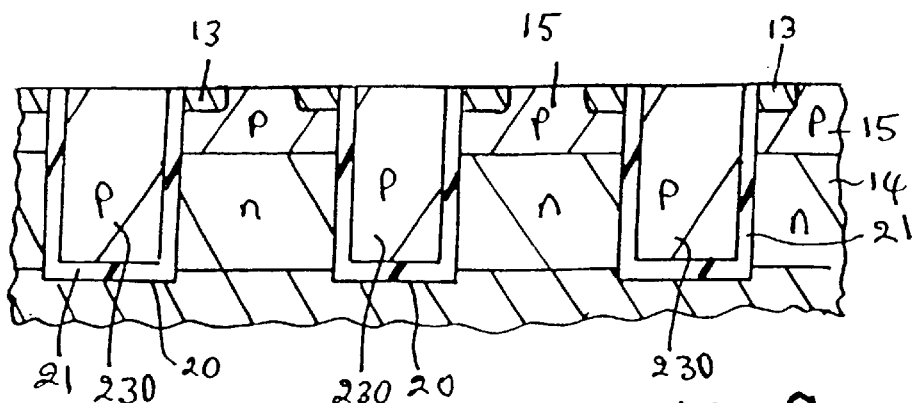
Figure 10:
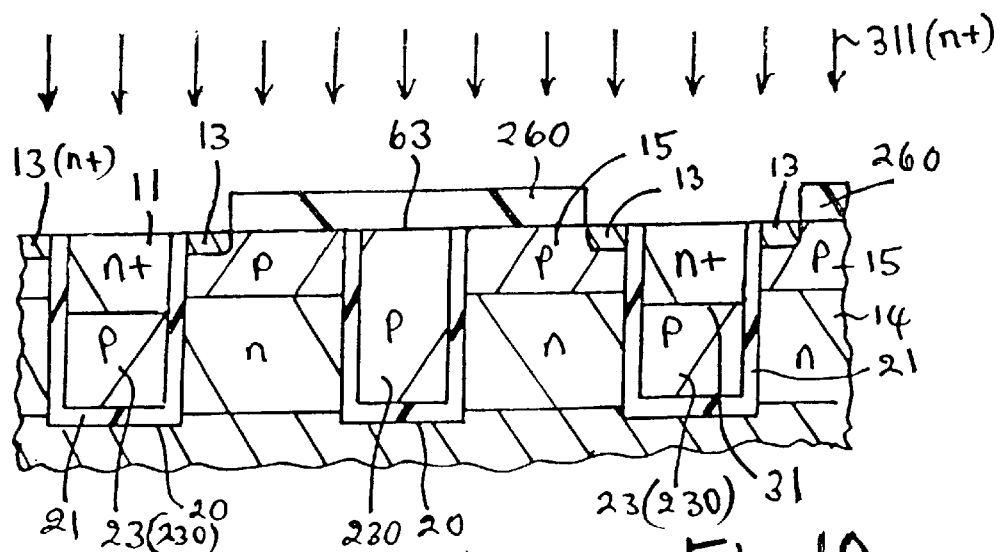

Other quite simple processes in accordance with the invention may be used. FIGS. 9 and 10 depict stages in one such other process of manufacture which, in overview, includes the following steps:

(a) etching a trench 20 from a surface 10a of a semiconductor body 10 into the drain region 14 (through 14 and into 14a, in the example shown), (b) providing insulating material 21 on the bottom and sidewalls of the trench 20 by, for example, thermal oxidation, (c) depositing semiconductor material 230 for providing the electrode 23 of a first conductivity type (p) in the trench 20, (d) masking selected areas 63 of the trench 20 (with a masking layer 260) while doping the deposited semiconductor material 230 in an upper part of the trench 20 with dopant 311 of the second conductivity type (n) to provide the insulated gate electrode 11 in an upper part of the trench 20 and to form the p-n junction 31 between the gate electrode 11 and a remaining lower electrode 23 of the first conductivity type in the lower part of the trench 20, and (e) providing at the selected areas 63 an electrical connection between the lower electrode 23 and a source 13,33 of the transistor to shield the gate electrode 11 from most of the drain region 14,14a and to form the p-n protection diode between the gate electrode 11 and source 13,33 of the transistor.

This process results in a device structure in which the semiconductor material 230 is over-doped in the upper part of the trench 20 with an n+ doping concentration 311 to form the gate electrode 11 except at the source-connection area 63 of the trench 20.

This doping may be carried out by implantation and/or diffusion of the dopant 311. As illustrated in FIG. 9, the source region 13 may be present in the device structure before providing the masking layer 260. However, the source region may be provided subsequently. Thus, for example, the same doping step of FIG. 10 may even be carried out (i) to form the source region 13 in the semiconductor body 10 and (ii) to introduce a doping concentration n+ into the semiconductor material of the gate electrode 11 in the upper part of the trench. This variation is illustrated in FIG. 10; no source region 13 is formed below the masking layer 260 in this case. It should be noted that by diffusing the implanted dopant, the n+ concentration in the gate electrode 11 can be easily made deeper than the n+ concentration of the source region 13, due to the faster diffusion rate in polycrystalline silicon as compared with monocrystalline silicon.

This doping step of FIG. 10 may even be carried out as a modification of the process of FIGS. 4 to 7. In this case, the semiconductor material 110 deposited in FIG. 6 may have a lower doping concentration (n) or even be un-doped. The n+ implantation of dopant 311 in FIG. 10 (and its subsequent diffusion) can then provide the high doping concentration (n+) of the gate electrode 11. This process permits the gate electrode 11 to have a high doping concentration n+ that reduces in magnitude to a lower value n adjacent to the p-n junction 31 with the lower electrode 23.

Figure 11:
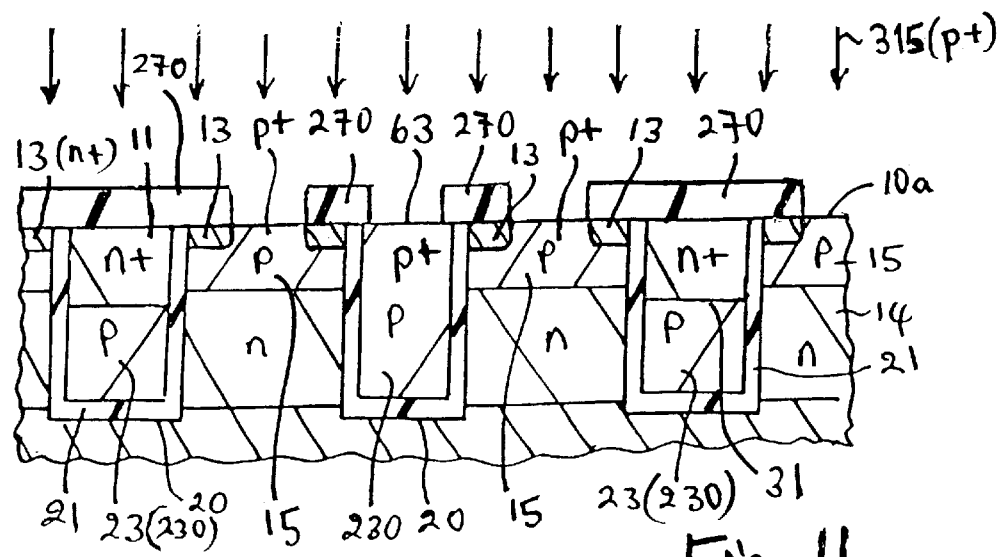

FIG. 11 illustrates another advantageous process variation, in which a doping step with dopant 315 of the opposite conductivity type (p+) is carried out. This may be carried out by implantation and/or diffusion of the dopant 315. The implanted and/or diffused dopant 315 (i) forms a p+ part of the transistor body region 15 in the semiconductor body 10 and (ii) introduces a doping concentration p+ into the semiconductor material 230 in the trench 20 (at least at an area 63 where the lower electrode 23 is to be connected to the source 13,33).

This doping step of FIG. 11 can be performed at various stages and may be either masked or unmasked. FIG. 11 illustrates its performance after the n+ source region 13 and n+ gate electrode 11 have been provided. However, this p+ doping step can be carried out earlier in the manufacturing process, for example before the n+ source region 13 and/or the n+ gate electrode 11 have been provided. FIG. 11 illustrates this doping step being masked with a masking layer 270 over the areas of the source region 13 and gate electrode 11. However, this p+ doping step can be carried out unmasked when its p+ dopant concentration 315 is less than the n+ dopant concentrations of the source region 13 and the n+ gate electrode 11. It should be noted that by diffusing the implanted dopant, the p+ concentration in the connection region 23a can be easily made deeper than the p+ concentration in the body region 11, due to the faster diffusion rate in polycrystalline silicon as compared with monocrystalline silicon. Thus, even in an unmasked doping step, the p+ dopant 315 in the monocrystalline body 10 can be kept shallower than the source region 13 (and hence shallower than the channel-accommodating portion of the region 15), while diffusing the p+ dopant 315 deeper in the polycrystalline material of the connection region 23a.

Figure 12:
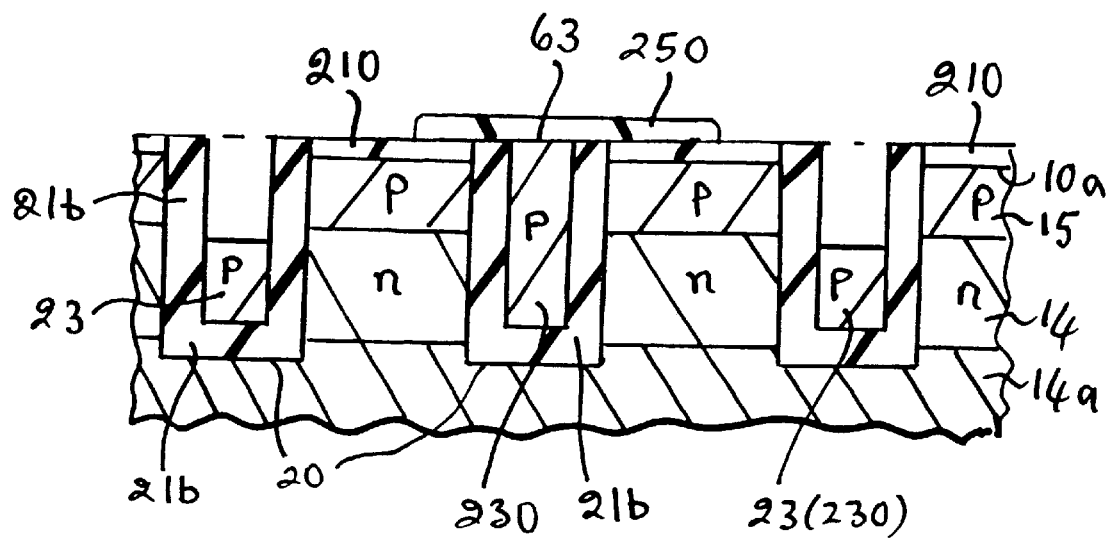
Figure 13:
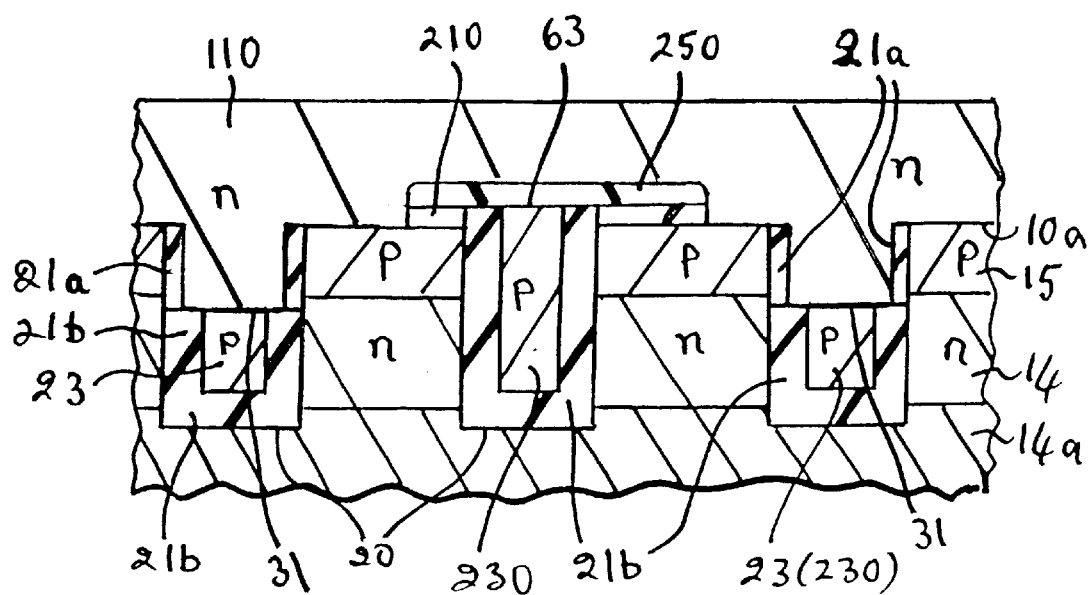

In the embodiments of FIGS. 1 to 11, there is a uniform thickness of insulating material lining the walls of the upper and lower parts of the trench 20. FIGS. 12 and 13 illustrate a different embodiment, in which the insulated trench 20,21 of the manufactured transistor comprises a thicker insulator 21b adjacent to the lower electrode 23 than adjacent to the gate electrode 11. This structure can be achieved by:

depositing the thicker insulating material 21b in the trench 20 before depositing the electrode material 230 of FIG. 4;

etching back the electrode material 230 as in FIG. 5, to produce the structure of FIG. 12;

then etching away the exposed insulating material 21b (i.e. from the sidewalls of the upper part of the trench), and providing a thinner insulating layer 21a before depositing the semiconductor material 110 for the gate electrode 11.

The thinner insulating layer 21a can be provided by deposition or by oxidation. In each case, it is also provided on top of the lower electrode 23 as well as on the upper sidewalls of the trench 20. The part of the layer 21a on top of the lower electrode 23 can be removed by vertical (anisotropic) etching, while leaving the layer 21a on the upper sidewalls of the trench 20. Thus, the top of the lower electrode 23 can be re-exposed to form the p-n junction 31 with the gate electrode 11.

It will be evident that many other variations and modifications are possible within the scope of the present invention. At the source-connection area 63 of the trench 20 in all the embodiments shown in the drawing Figures, the lower electrode 23 has a connection region 23a that extends through the upper part of the trench 20 where it is contacted by the source electrode 33. This is advantageous in avoiding a step-down into the trench 20 for the source electrode 33. However, embodiments are possible, in which, at the source-connection area 63 of the trench 20, an insulated hole is provided in the semiconductor material of the gate electrode 11. In this case, the source electrode connection can extend through the insulated hole into contact with the lower electrode 23.

In very large power devices, series resistance of the doped polycrystalline silicon may become a problem, especially for the gate resistance. To resolve this problem, the gate electrode 11 may comprise a metal or metal silicide remote from the p-n junction 31 with the lower electrode 23. Similarly, the lower electrode 23 may comprise a metal or metal silicide remote from the p-n junction 31 with the gate electrode 11.

In the embodiments shown in the drawing Figures, the source region 13 is formed within the monocrystalline silicon body 10. However, the transistor source could alternatively be formed with material 11' deposited on the body surface 10a. Such deposited material 11' may be, for example, n+ doped polycrystalline silicon. It may even be a metal or metal silicide that forms a Schottky barrier with the p-type region 15, instead of a p-n junction.

In the embodiments shown in the drawing Figures, the channel-accommodating body region 15 is of opposite (p) conductivity type to the n-type conductivity of the source and drain regions 13 and 14. The devices are MOSFETs or IGBTs. Trench-gate field-effect transistors are also known in which the channel-accommodating body region 15' is of the same conductivity type as the source and drain regions 13 and 14. In this case, the conductive channel 12 is formed by charge-carrier accumulation by means of the trench-gate 11, instead of by inversion. Such accumulation-mode devices are sometimes called "ACCUFETs". The present invention may be used with advantage to design fast-switching accumulation-mode transistors with trenched double electrode structure 11 & 23 and p-n protection diode 31.

The illustrated embodiments of the invention have been described with reference to a discrete power transistor, having its second main electrode contacting the region 14a at the back major surface of the body 10. However, an integrated transistor is also possible in accordance with the invention. In this case, the region 14a may be a doped buried layer between a device substrate and the epitaxial low-doped drain region 14. This buried layer region 14a may be contacted by an electrode (drain or anode) at the front major surface 10a, via a doped peripheral contact region which extends from the surface 10a to the depth of the buried layer. Thus, the trenched-electrode structure 11,31,23 of the present invention may be used for fast switching and gate protection of integrated transistors. The transistor may be a cellular power device or even a simpler non-cellular non-power transistor. Even in a power device having its second main electrode at the back main surface, various known circuits (such as gate-control circuits) may be integrated with the device in an area of the body 10, between the active transistor cellular area and a peripheral termination scheme. Typically the circuit elements of the circuit are fabricated with their own layout in this circuit area using some of the same masking and doping steps as are used for the transistor cells.

The particular examples described and shown in the drawing Figures are n-channel transistors, in which the regions 13 and 14 are n-type, the region 15 is p-type, and an electron inversion channel 12 is induced in the region 15 by the insulated gate electrode 11. By using opposite conductivity type dopants, a p-channel device can be constructed in accordance with the invention. In this case, the regions 13 and 14 and gate electrode 11 are of p-type conductivity, the region 15 and lower electrode 23 are of n-type. A hole inversion channel 12 isinduced in the n-type region 15 by the insulated gate electrode 11.

From reading the present disclosure, other variations and modifications will be apparent to persons skilled in the art. Such variations and modifications may involve equivalent and other features which are already known in the art and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

The applicants hereby give notice that new claims may be formulated to any such features and/or combinations of such features during the prosecution of the present application or of any further application derived therefrom.

What is claimed is:

1. A trench-gate field-effect transistor comprising a semiconductor body in which an insulated trench extends from a surface of the body into a drain region of the transistor, a gate electrode comprising a semiconductor material of one conductivity type is present in an upper part of the trench to form a gate of the transistor insulated by the trench, and a lower electrode is present in a lower part of the trench and is connected to a source of the transistor separate from the drain region to shield the gate from most of the drain region, the transistor being characterized in that the lower electrode comprises a semiconductor material of a conductivity type opposite to the one conductivity type of said gate electrode, and that the semiconductor material of the lower electrode adjoins the semiconductor material of the gate electrode to form a p-n junction between the gate electrode and the lower electrode.

2. A transistor as claimed in claim 1, further characterised in that the semiconductor material of the lower electrode has a doping concentration of the opposite conductivity type that is lower in magnitude than the doping concentration of the one conductivity type of the gate electrode.

3. A transistor as claimed in claim 2, further characterised in that the semiconductor material of the lower electrode has a doping concentration of the opposite conductivity type that is less than $10^{18}$ dopant atoms $cm^{-3}$.

4. A transistor as claimed in claim 1, further characterised in that the semiconductor material of the gate electrode has a doping concentration of the one conductivity type that reduces in magnitude adjacent to the p-n junction with the lower electrode.

5. A transistor as claimed in claim 1, further characterised by having a power device layout in which the lower electrode is connected to a source electrode at distributed locations in the layout.

6. A transistor as claimed in claim 1, further characterised in that, at a source-connection area of the trench, the lower electrode has a connection region of said opposite conductivity type that extends through the upper part of the trench where it is contacted by a source electrode.

7. A transistor as claimed in claim 6, further characterised in that, the semiconductor material that provides the lower electrode is present from the lower part of the trench through the upper part of the trench, and is over-doped in the upper part with a doping concentration of the one conductivity type to form the gate electrode except at the source-connection area of the trench.

8. A transistor as claimed in claim 1, further characterised in that the insulated trench comprises a thicker insulator adjacent to the lower electrode than adjacent to the gate electrode.

* * * * *